(12) United States Patent
Baerd et al.

(10) Patent No.: US 9,386,729 B2
(45) Date of Patent: Jul. 5, 2016

(54) ENERGY CONVERSION DEVICE, IN PARTICULAR FOR UNDERWATER COMPRESSION AND PUMPING STATION, WITH IMPROVED COOLING MEANS

(75) Inventors: Henri Baerd, Champagne sur Seine (FR); Guillaume Godfroy, Versailles (FR)

(73) Assignee: GE Power Conversion Technology, Ltd., Rugby, Warwickshire (GB)

( * ) Notice: Subject to any disclaimer, the term of this patent is extended or adjusted under 35 U.S.C. 154(b) by 1039 days.

(21) Appl. No.: 13/419,725

(22) Filed: Mar. 14, 2012

(65) Prior Publication Data

US 2013/0032314 A1 Feb. 7, 2013

(30) Foreign Application Priority Data

Mar. 14, 2011 (FR) ...................... 11 52041

(51) Int. Cl.
*E21B 41/00* (2006.01)
*H05K 7/20* (2006.01)
*E21B 33/035* (2006.01)

(52) U.S. Cl.
CPC ........ *H05K 7/20927* (2013.01); *E21B 33/0355* (2013.01); *E21B 41/0007* (2013.01); *H05K 7/20272* (2013.01)

(58) Field of Classification Search
CPC . E21B 33/0355; E21B 33/037; E21B 36/001; E21B 41/0007; H05K 7/20272; H05K 7/20927
USPC ...................... 166/335, 368, 302; 165/104.33
See application file for complete search history.

(56) References Cited

U.S. PATENT DOCUMENTS

| | | | | |
|---|---|---|---|---|
| 4,357,989 A | * | 11/1982 | Holzle | ............................ 165/45 |
| 5,277,028 A | * | 1/1994 | Worner | ................. B62D 5/061 |
| | | | | 417/292 |
| 6,059,539 A | * | 5/2000 | Nyilas et al. | .................. 417/228 |
| 6,145,584 A | * | 11/2000 | Baynes et al. | .................. 165/45 |
| 7,149,084 B2 | * | 12/2006 | Matsushima | ............. G06F 1/20 |
| | | | | 165/80.4 |
| 9,127,897 B2 | * | 9/2015 | Hernandez | ............ E21B 36/001 |
| 9,163,482 B2 | * | 10/2015 | Kanstad | ................ E21B 36/001 |
| 2010/0139544 A1 | * | 6/2010 | Bo | ............................... 114/337 |
| 2010/0254087 A1 | * | 10/2010 | Godfroy et al. | ................ 361/699 |
| 2012/0000630 A1 | * | 1/2012 | Reiss et al. | ............... 165/104.21 |
| 2012/0090808 A1 | * | 4/2012 | Scofield | ........................ 165/45 |
| 2012/0189472 A1 | * | 7/2012 | McDonald | ..................... 417/372 |

FOREIGN PATENT DOCUMENTS

EP 1310759 5/2003

OTHER PUBLICATIONS

French Search Report, dated Aug. 19, 2011, in FR 1152041.

* cited by examiner

*Primary Examiner* — Matthew R Buck
(74) *Attorney, Agent, or Firm* — Wood IP LLC

(57) ABSTRACT

The energy conversion device (10) includes a power module (14), a unit (16) for cooling the power module (14), and a sealed enclosure (12) housing the power module (14) and at least part of the cooling unit (16). The cooling unit (16) includes a cooling circuit (18), in which a coolant circulates, a first heat exchanger (20) with the power module (14), through which the coolant passes, and at least one pump (24) making the coolant circulate in the circuit (18). The cooling circuit (18) includes a pressure regulating branch (26), extending between an outlet and an inlet of the driving pump (24), the regulating branch (26) including a pressure regulating valve (28), normally closed, capable of opening when the pressure difference between the outlet and the inlet of the driving pump (24) exceeds a predetermined threshold.

8 Claims, 3 Drawing Sheets

ENERGY CONVERSION DEVICE, IN PARTICULAR FOR UNDERWATER COMPRESSION AND PUMPING STATION, WITH IMPROVED COOLING MEANS

The present invention relates to an energy conversion device, also called a converter, in particular for an electric driving system of an underwater compression and pumping station.

Such an underwater station is intended for the exploitation of oil or natural gas, generally in deep waters.

Already known in the state of the art is an energy conversion device, in particular for an electric driving system for underwater compression and pumping stations. Such an energy conversion device comprises at least one power module, intended to perform the energy conversion function in a known manner.

The energy conversion device also comprises means for cooling the power module, and a sealed enclosure housing the power module and at least part of the cooling means.

The cooling means generally comprises a cooling circuit in which a coolant circulates, passing through a heat exchanger with the power module. The cooling means also comprises a pump for making the coolant circulate in the circuit.

It is possible to provide for the use of a dielectric oil as coolant.

When the energy conversion device is arranged on a sea bottom, the temperature of the seawater surrounding the device is generally between 0° C. and 10° C. Thus, when idle, the dielectric oil contained in the cooling circuit also has a temperature between 0° C. and 10° C.

However, the oil has a high viscosity at low temperatures, with the result that it is difficult to make that oil circulate in the circuit. This results in a significant pressure loss in the first exchanger, as well as in the other parts of the circuit, such as lines or a second heat exchanger, whereas the flow rate of the pump remains substantially constant.

In that case, the pressure at the outlet of the pump increases, which creates stresses on the pump and on a motor driving that pump. Such stresses reduce the lifetime of the pump, and generally involve oversizing of the pump, the motor driving the pump, and the electric distribution circuit supplying the motor.

The invention in particular aims to resolve this drawback, by providing an energy conversion device in which the pump is protected from the viscosity problems of the oil at low temperatures.

To that end, the invention in particular relates to an energy conversion device, in particular for an electric driving system of an underwater compression and pumping station, comprising a power module, a means for cooling the power module, and a sealed enclosure housing the power module and at least part of the cooling means, the cooling means including:
 a cooling circuit, in which a coolant circulates,
 a first heat exchanger with the power module, through which the coolant passes, and
 at least one pump making the coolant circulate in the circuit, characterized in that the cooling circuit comprises a pressure regulating branch, extending between a first branch line connected to an outlet of the driving pump, and a second branch line connected to an inlet of said driving pump, the regulating branch including a pressure regulating valve, normally closed, capable of opening when the pressure difference between the outlet and the inlet of the driving pump exceeds a predetermined threshold.

When the viscosity of the coolant, in particular when said coolant is a dielectric oil, is too high, making the circulation of that fluid difficult in the cooling circuit, in particular in the first exchanger, while the flow rate of the pump remains substantially constant, the pressure at the outlet of the pump increases.

The pressure regulating valve is then open, with the result that part of the fluid is deviated by the regulating branch to the inlet of the pump, thereby reducing the quantity of fluid circulating in the circuit, and therefore facilitating that circulation by reducing the stresses on the material.

The fluid circulating in the circuit, through the first exchanger or through the regulating branch, is heated, in particular under the effect of the friction between said viscous fluid and the walls of the conduits forming the cooling circuit. In this way, the temperature of the fluid increases little by little until its viscosity is reduced below a predetermined threshold such that said fluid can circulate without noteworthy stress.

An energy conversion device according to the invention can also comprise one or more of the following features, considered alone or according to all technically possible combinations:
 the pressure regulating valve comprises:
  a valve body in which an intake conduit, connected to the first branch line, and a discharge conduit, connected to the second branch line, emerge,
  a piston, movable in the valve body between a covering position, in which the piston rests sealably on a seat so as to cover the intake conduit, and a release position, in which the piston is moved away from the seat to allow fluid communication between the intake and discharge conduits, and
  an elastic return member to return the piston to its covering position;
 the cooling circuit comprises a three-way control valve, including:
  an intake path, connected to an outlet branch of the first heat exchanger,
  a first outlet path, connected to an inlet branch of a second heat exchanger, and
  a second outlet path, connected to a branch connected to the inlet of the driving pump;
 the three-way control valve is controlled as a function of the temperature of the coolant at a predetermined point, for example at the inlet of that valve, and configured to connect the inlet path to the first outlet path when said temperature of the coolant is above a predetermined temperature threshold, and to connect the inlet path to the second outlet path when said temperature of the coolant is below the predetermined temperature threshold;
 the enclosure is at least partially filled with gas, preferably inert gas, for example nitrogen;
 the enclosure is at least partially filled with a coolant, such as dielectric oil, the coolant circuit being at least partially submerged in said coolant;
 the enclosure is completely filled with coolant and comprises a pressure limiting device, intended to limit the pressure in the enclosure when said coolant expands; and
 the coolant is a dielectric fluid, preferably a dielectric oil.

The invention also relates to an electric driving system for an underwater compression and pumping station, comprising an energy conversion device as previously defined.

The invention will be better understood upon reading the following description, provided solely as an example and done in reference to the appended figures, in which:

FIG. 1 shows an energy conversion device 10 according to a first embodiment of the invention.

Figure 1:
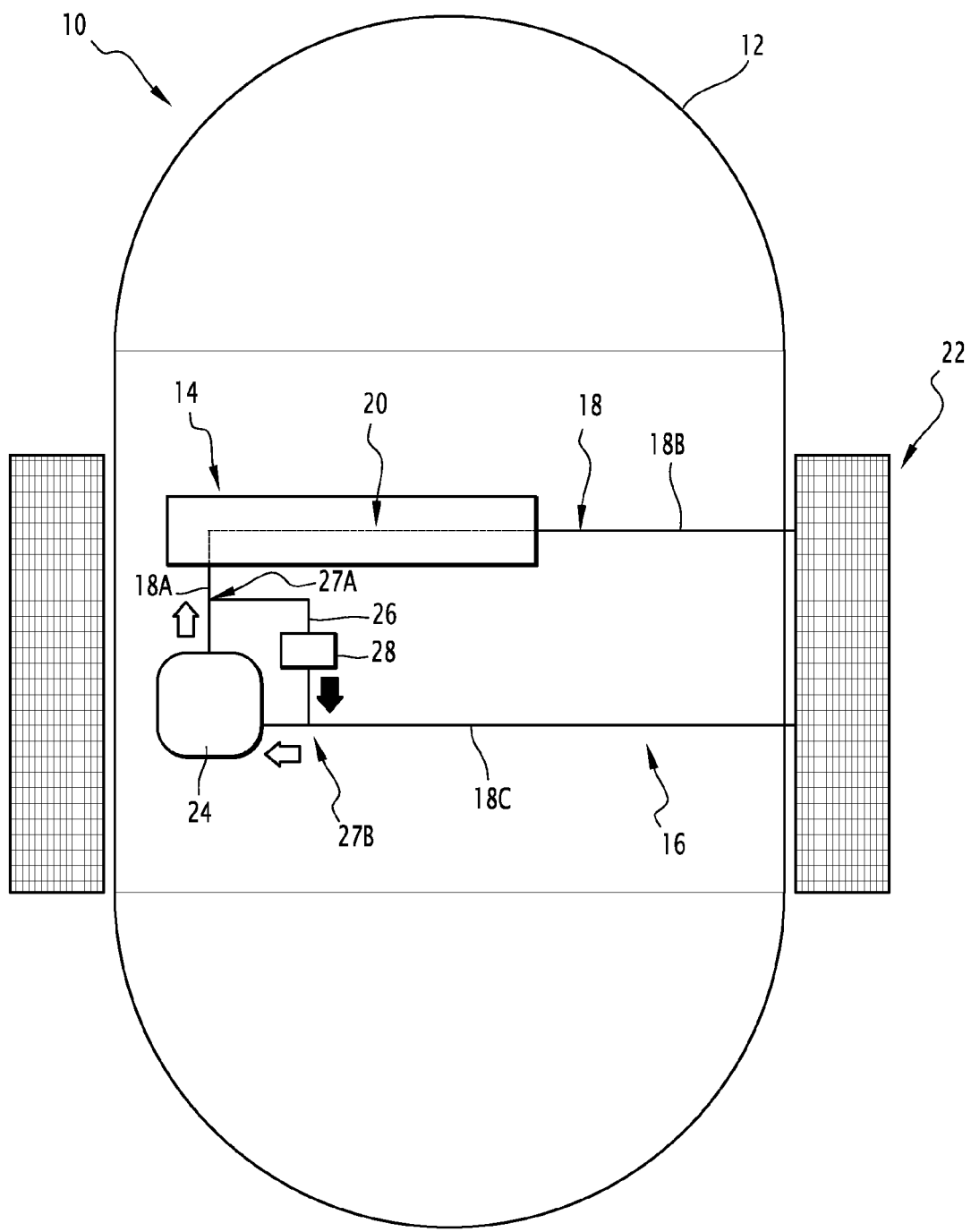
FIG. 1 is a diagrammatic view of an energy conversion device according to a first embodiment of the invention.

The energy conversion device 10 is in particular designed to equip an electric driving system of an underwater compression and pumping station. To that end, this energy conversion device 10 is intended to be arranged on a sea bottom, at a depth generally comprised between several meters and several kilometers.

The energy conversion device 10 comprises a sealed enclosure 12, in which a power module 14 and at least part of the cooling means 16 for said power module 14 are housed.

In a known manner, the power module 14 comprises electronic power elements, and is capable of performing an energy conversion function.

The cooling means 16 comprises a cooling circuit 18, in which a coolant, advantageously a dielectric coolant, circulates.

Preferably, the coolant is a dielectric oil, such as silicone oil or the oil marketed under reference MIDEL 7131 by Midel®.

The cooling means 16 also comprises a first heat exchanger 20 of the traditional type, designed to exchange heat with the power module 14, through which the cooling circuit 18 passes. The first heat exchanger 20 for example assumes the form of a hollow plate, against which electronic power elements of the module 14 are arranged, and in which the dielectric oil circulates. The heat exchanger can also comprise heat exchange means by forced circulation through components of the power module 14, such as resistances and coiled elements.

The cooling means 16 also comprises a second outside heat exchanger 22 of the traditional type, arranged outside the enclosure 12, such that the dielectric oil that circulates in said second heat exchanger 22 exchanges heat with the environment of the energy conversion device 10, i.e. the seawater. It will be noted that the seawater, in particular at great depths, typically has a temperature below 10° C., generally approximately equal to 4° C.

Alternatively, the second heat exchanger 22 can be arranged inside the enclosure 12, in direct contact with the wall of said enclosure 12, so as to discharge calories toward the outside seawater surrounding said enclosure 12.

In this way, the dielectric oil collects calories from the power module 14 by means of the first heat exchanger 20, and delivers calories to the seawater by means of the second heat exchanger 22.

The cooling means 16 lastly comprises at least one pump 24 for making the dielectric oil circulate in the circuit 18. Preferably, the cooling means 16 comprises at least one backup pump, arranged in parallel with the pump 24 so as to form a redundancy of pumps, capable of taking over in the event the pump 24 malfunctions.

Advantageously, the pump 24 is of the volumetric type.

According to the described embodiment, the enclosure 12 is filled with gas, preferably inert gas, for example nitrogen.

However, alternatively, the enclosure 12 could be filled with a coolant, such as dielectric oil, so that the cooling circuit 18 is partially or completely submerged in said coolant. In the event the enclosure 12 is completely filled with liquid, the device 10 preferably comprises a pressure limiting device, intended to limit the pressure in the enclosure 12 when said fluid expands, in particular under the effect of the temperature.

The circuit 18 comprises at least one first branch 18A extending between the pump 24 and the first exchanger 20, at the outlet of the pump 24, at least one second branch 18B extending between the first exchanger 20 and the second exchanger 22, and at least one third branch 18C extending between the second exchanger 22 and the pump 24, at the inlet of said pump 24.

The cooling circuit 18 also comprises a regulating branch 26, extending between a first branch line 27A with the first branch 18A, at the outlet of the driving pump 24, and a second branch line 27B with the third branch 18C, at the inlet of the driving pump 24. In other words, the regulating branch 26 extends in parallel with the pump 24, between the outlet and the inlet of said pump 24.

The regulating branch 26 comprises a pressure regulating valve 28, which is normally closed, capable of opening when the pressure difference between the outlet and the inlet of the driving pump 24 exceeds a predetermined threshold, for example 5 bars.

Figure 2:
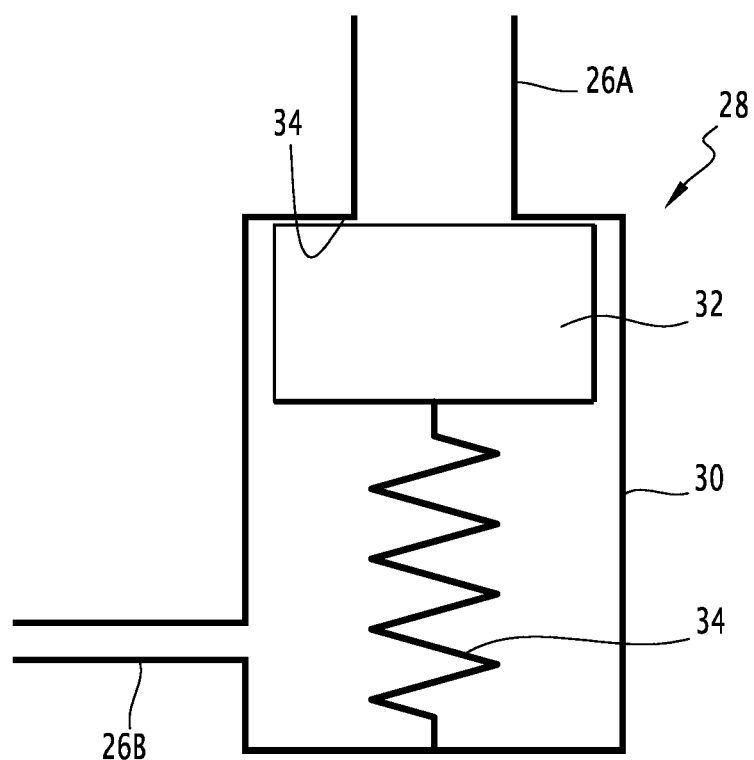
FIG. 2 is a diagrammatic axial cross-sectional view of a pressure regulating valve equipping the device of FIG. 1.

One example of a regulating valve 28 is shown in FIG. 2.

This regulating valve 28 comprises a valve body 30, in which an inlet conduit 26A, connected to the first branch line 27A, and a discharge conduit 26B, connected to the second branch line 27B, emerge.

The regulating valve 28 also comprises a piston 32, movable in the valve body 30 between a covering position, in which the piston 32 rests sealably on a seat 34 so as to cover the intake conduit 26A, and a release position, in which the piston is moved away from the seat 34 to allow fluid communication between the intake 26A and discharge 26B conduits. The pressure regulating valve also comprises an elastic return member 34 to return the piston 32 to its covering position In this way, when the pressure at the outlet of the pump 24 increases, this pressure causes a first pressure force on a first surface of the piston 32 that is across from the intake conduit 26A. This pressure force opposes the sum of an elastic return force caused by the elastic member 34 and a second pressure force opposite the first, caused by the pressure at the inlet of the pump 24 on a second surface of the piston 32 that is turned toward the discharge conduit 26B.

The stiffness of the elastic member 34 is chosen as a function of said predetermined threshold for the pressure difference between the outlet and the inlet of the pump, to allow the valve 28 to open when said pressure difference is above that predetermined threshold.

Figure 3:
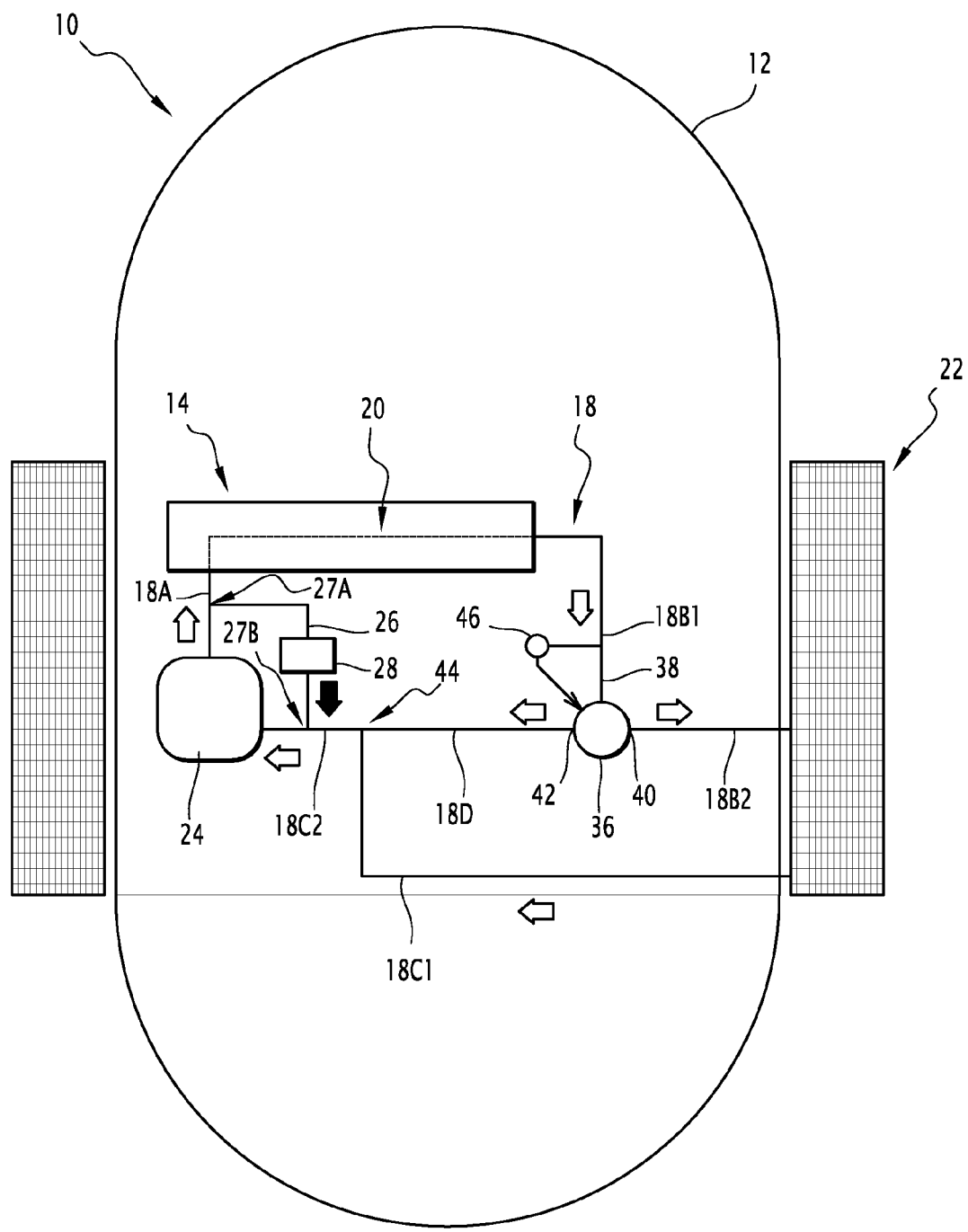
FIG. 3 is a view similar to FIG. 1 of an energy conversion device according to a second embodiment of the invention.

FIG. 3 shows an energy conversion device 10 according to a second embodiment of the invention. In this figure, the elements similar to those of the preceding figures are designated using identical references.

According to this second embodiment, the cooling circuit 18 comprises a three-way control valve 36, including an intake path 38, connected to an outlet branch 18B1 of the heat exchanger 20, a first outlet path 40, connected to an inlet branch 18B2 of the second exchanger 22, and a second outlet path 42, connected to a branch 18D extending toward the inlet of the driving pump 24.

In fact, the circuit 18 comprises a branch line 44 between said branch 18D, an outlet branch 18C1 of the second heat exchanger 22, and an inlet branch 18C2 in the pump 24.

Preferably, the three-way valve 36 is controlled as a function of the temperature of the dielectric oil at a predetermined point, in particular in the branch 18B1 connected to its inlet path 38. To that end, a temperature sensor 46 is provided to measure the temperature on that branch 18B1. Alternatively, said temperature sensor 46 can be incorporated into the three-way control valve 36, to measure the temperature of the oil at the intake path 38.

The three-way control valve 36 is configured to connect the intake path 38 to the first outlet path 40 when the temperature of the dielectric oil measured by the sensor 46 is above a predetermined temperature threshold, and to connect the intake path 38 to the second outlet path 42 when said temperature is below that threshold.

In this way, when the temperature of the dielectric oil is too low, for example below 30° C., its viscosity is considered too high, with the result that that dielectric oil is redirected toward the pump 24, through the branch 18D, rather than being directed toward the second heat exchanger 22, in which the oil would lose calories.

However, when the temperature of the oil corresponds to a satisfactory viscosity for that oil, the valve 36 directs the oil toward the second heat exchanger 22 for normal operation of the cooling circuit 18.

Different operating modes of the energy conversion device 10 as described in reference to FIG. 3 will be described below.

A first operating mode of this device 10 is a cold-start mode. This cold-start mode is in particular used after a prolonged stoppage of the device, when the temperature of the oil is close to that of the surrounding seawater. In that case, the viscosity of the oil is high, with the result that when the pump 24 is put in operation, the pressure difference between the outlet and the inlet of the pump is relatively high.

This high pressure difference exceeds the predetermined threshold, with the result that the valve 28 is open. Part of the oil therefore passes through the regulating branch 26, therefore reducing the quantity of oil circulating in the first heat exchanger 20.

The oil passing through the heat exchanger 20 exits through the branch 18B1, its temperature remaining low, and below the predetermined switching threshold for the three-way control valve 36. This valve 36 therefore directs the oil toward the branch 18D, toward the pump 24.

The oil thus circulates while heating up little by little, in particular through friction of the viscous oil against the walls of the various components of the circuit 18.

This temperature increase implies a decrease in viscosity, with the result that the circulation of the oil in that circuit is favored. The pressure difference between the outlet and the inlet of the pump 24 is then reduced little by little, until the valve 28 is completely closed.

When the oil reaches a temperature at which its viscosity is sufficient to allow proper operation of the first heat exchanger 20, one goes to a second operating mode, in which the power module 14 is brought into operation.

In this operating mode, the valve 28 is closed, and all of the oil passes through the first heat exchanger 20.

When the power module 14 is in operation, the heat emitted by said power module heats the oil in the heat exchanger 20, thereby increasing the temperature thereof. The temperature of the oil increases until it exceeds the predetermined threshold beyond which the three-way control valve 36 directs the oil toward the second heat exchanger 22.

One then goes to a normal operating mode of the cooling circuit 18.

It will be noted that the invention is not limited to the embodiment previously described, but may assume various alternatives without going beyond the scope of the claims.

In particular, the cooling circuit 18 can comprise several pressure regulating branches.

For example, the cooling circuit 18 may comprise, in addition to the regulating branch 26, a second regulating branch extending between the inlet and the outlet of the first exchanger 20, so as to limit the pressure difference between that inlet and that outlet, and thereby limit the stresses in said first exchanger 20. In that case, said second regulating branch comprises a second pressure regulating valve, which is normally closed, capable of opening when the pressure difference between the outlet and the inlet of the first exchanger 20 exceeds a predetermined threshold, for example 3 bars.

It is also possible to consider arranging another pressure regulating branch between the inlet and the outlet of the second exchanger 22.

Providing several pressure regulating branches makes it possible to adapt the predetermined threshold for opening the corresponding valve as a function of the type of material. In this way, it is possible to provide a first regulating branch 26 for the pump 24, whereof the valve opens for a pressure difference greater than 5 bars, and a second regulating branch for the first exchanger 20, whereof the valve opens for a pressure difference above 3 bars.

According to another alternative, all of the pressure regulating branches extend from a pressure reference point. This reference point is for example formed by the inlet of the pump, because it is known that the pressure at the inlet of the pump 24 is at most equal to the static pressure of the circuit 18, i.e. the pressure 24 when the pump is idle.

In this way, it is relatively simple to tare the valve of each regulating branch, to limit the pressure at the point to which said regulating branch extends, as a function of the known pressure of the reference point from which said regulating branch extends. Control is thus allowed, at any desired point of the circuit, of the relative pressure of that point with the pressure of the reference point.

The invention claimed is:

1. An energy conversion device for an electric driving system of an underwater compression and pumping station, comprising a power module, a cooling system for cooling the power module, and a sealed enclosure housing the power module and at least part of the cooling system and partially filled with a gas or a liquid, the cooling system including:
a cooling circuit, in which coolant circulates,
a first heat exchanger configured to exchange heat with the power module, through which the coolant passes, and
at least one pump configured to circulate the coolant in the cooling circuit,
wherein the cooling circuit comprises a pressure regulating valve, extending between a first branch line connected to an outlet of the at least one pump and an inlet branch of the first heat exchanger, and a second branch line connected to an inlet of the at least one pump, the pressure regulating valve is configured to open only when the pressure at the outlet of the at least one pump is greater than the pressure at the inlet of the at least one pump, and to receive a portion of the coolant from the outlet of the at least one pump to vary the coolant flow to the first heat exchanger.

2. The energy conversion device according to claim 1, wherein the pressure regulating valve comprises:
a valve body including an intake conduit connected to the first branch line, and a discharge conduit, connected to the second branch line,
a piston, movable in the valve body between a covering position, in which the piston rests sealably on a seat so as to cover the intake conduit, and a release position, in which the piston is moved away from the seat to allow fluid communication between the intake and discharge conduits, and an elastic return member to return the piston to its covering position.

3. The energy conversion device according to claim 1, wherein the cooling circuit comprises a three-way control valve, including:

an intake path, connected to an outlet branch of the first heat exchanger, a first outlet path, connected to an inlet branch of a second heat exchanger, and a second outlet path, connected to a branch connected to the inlet of the at least one pump.

4. The energy conversion device according to claim 3, wherein the three-way control valve is controlled as a function of the temperature of the coolant at the inlet of the three-way control valve, and configured to connect the inlet path to the first outlet path when said temperature of the coolant is above a predetermined temperature threshold, and to connect the inlet path to the second outlet path when said temperature of the coolant is below the predetermined temperature threshold.

5. The device according to claim 1, wherein the coolant circulated by the cooling circuit is a dielectric fluid.

6. The energy conversion device according to claim 2, wherein the cooling circuit comprises a three-way control valve, including:

an intake path, connected to an outlet branch of the first heat exchanger, a first outlet path, connected to an inlet branch of a second heat exchanger, and a second outlet path, connected to a branch connected to the inlet of the at least one pump.

7. An electric driving system for an underwater compression and pumping station, comprising:

an energy conversion device including:

a power module configured to perform energy conversion;

a cooling system configured to cool the power module;

a sealed housing partially filled with a gas or a liquid, and configured to house the power module and the cooling system;

the cooling system comprising:

a coolant circuit configured to circulate coolant a heat exchanger configured to exchange heat with the power module, through which the coolant passes;

at least one pump configured to pump the coolant in the cooling circuit; and a pressure regulating valve connected between an outlet of the at least one pump and an inlet branch of the heat exchanger, and between an inlet of the at least one pump, wherein when the pressure at the outlet of the at least one pump is greater than the pressure at the inlet of the at least one pump, the pressure regulating valve is configured to receive a portion of the coolant from the outlet of the at least one pump, to vary the coolant flow to the heat exchanger.

8. An energy conversion device for an underwater compressor, comprising:

a power module configured to perform energy conversion;

a cooling circuit comprising a pressure regulating valve and configured to circulate coolant through the power module;

a heat exchanger configured to exchange heat with the power module;

at least one pump configured to pump the coolant within the cooling circuit and in communication with the pressure regulating valve, wherein when the pressure at an outlet of the at least one pump is greater than the pressure at an inlet of the at least one pump, the pressure regulating valve is configured to receive a portion of the coolant from the outlet of the at least one pump, to vary the coolant flow to the heat exchanger.

* * * * *